United States Patent [19]

Norimatsu

[11] Patent Number: 5,113,152
[45] Date of Patent: May 12, 1992

[54] PLL FREQUENCY SYNTHESIZER WITH CIRCUIT FOR CHANGING LOOP FILTER TIME CONSTANT

[75] Inventor: Hidehiko Norimatsu, Tokyo, Japan
[73] Assignee: NEC Corporation, Japan
[21] Appl. No.: 687,329
[22] Filed: Apr. 18, 1991
[30] Foreign Application Priority Data
Apr. 19, 1990 [JP] Japan .................. 2-103414
[51] Int. Cl.⁵ .................. H03L 7/087; H03L 7/093
[52] U.S. Cl. .................. 331/11; 331/16; 331/17; 331/25; 331/DIG. 2
[58] Field of Search .................. 331/11, 14, 16, 17, 331/25, 12, DIG. 2

[56] References Cited
U.S. PATENT DOCUMENTS
3,421,105 1/1969 Taylor .................. 331/17 X
3,956,710 5/1976 Seitz et al. .................. 331/17 X Primary Examiner—Siegfried H. Grimm
Attorney, Agent, or Firm—Ostrolenk, Faber, Gerb & Soffen

[57] ABSTRACT

A phase locked loop (PLL) frequency synthesizer capable of switching the output frequency thereof at high speed. The frequency synthesizer has a second phase/frequency comparator and a second variable frequency divider in addition to a first phase/frequency comparator which is included in a PLL. The synthesizer switches over the time constant of a loop filter by the output of the second phase/frequency comparator, i.e., independently of the PLL which is responsive to the output of the first phase/frequency comparator. As a result, the time constant of the loop filter is switched over at an advanced timing to thereby reduce PLL tuning time.

6 Claims, 3 Drawing Sheets

PLL FREQUENCY SYNTHESIZER WITH CIRCUIT FOR CHANGING LOOP FILTER TIME CONSTANT

BACKGROUND OF THE INVENTION

The present invention relates to a frequency synthesizer using a phase locked loop (PLL) and, more particularly, to a PLL synthesizer capable of switching the output frequency thereof at high speed.

A conventional PLL synthesizer has a reference frequency oscillator, a fixed frequency divider for dividing the output frequency of the oscillator, a voltage controlled oscillator (VCO), a variable frequency divider for dividing the output frequency of the VCO, a phase/frequency comparator for comparing the outputs of the fixed and variable frequency dividers to output a difference therebetween, a charge pump to which the difference or deviation is applied, and a loop filter receiving and smoothing the output of the charge pump and feeding back the output thereof to the VCO as a control voltage. It is a common practice with this type of PLL synthesizer to cause the loop filter to select either one of a greater and a smaller time constant in order to enhance high-speed frequency switching and to stabilize the frequency. More specifically, the time constant of the loop filter is reduced at the time of frequency switching so as to promote rapid tuning. After the frequency switching, a lock signal is fed from the phase/frequency comparator to the loop filter to increase the time constant of the filter, thereby stabilizing the frequency. In practice, however, at the time when the switching operation is completed, the control voltage applied to the VCO has been deviated from an expected value due to the delay particular to detection and switching. Therefore, the initial frequency just after the switching is different from a predetermined one with the result that the switchover of the time constant of the loop filter is delayed. This in turn delays the tuning time of the PLL and prevents the frequency to be switched over at high speed.

SUMMARY OF THE INVENTION

It is therefore an object of the present invention to provide a PLL frequency synthesizer capable of switching the output frequency thereof at high speed.

It is another object of the present invention to provide a generally improved PLL frequency synthesizer.

A PLL synthesizer for switching an output frequency at high speed of the present invention cmprises a reference frequency oscillator, a VCO, a first and a second variable frequency divider for dividing the output of the VCO independently of each other, and each being provided with a particular divisor for frequency division, a first phase/frequency comparator for comparing the output of the reference frequency oscillator and the output of the first variable frequency divider, a second phase/frequency comparator for comparing the output of the reference frequency oscillator and the output of the second variable frequency divider, and a loop filter for smoothing the output of the first phase/frequency comparator to feed back a smoothed output thereof to the VCO and switching over the time constant thereof in response to the output of the second phase/frequency comparator.

A synthesizer of the present invention comprises a reference oscillator for generating a reference oscillation signal, a VCO for generating a VCO oscillation signal, the frequency of the VCO oscillation signal being varied with a control signal, first and second variable frequency dividers for frequency dividing the VCO signal in accordance with first and second divisors, respectively, first and second comparators for phase/frequency comparing the reference oscillation signal with the outputs of the first and second dividers, respectively, a filter for filtering the output of the first comparator to produce a filtered output and supply it to the VCO as the control signal, the time constant of the filter being changed in response to the output of the second comparator.

A method of generating an oscillation signal in response to a divisor signal in accordance with the present invention comprises the steps of (a) generating a first oscillation signal, (b) generating a second oscillation signal whose frequency changes in response to a control signal, (c) responsive to first and second divisor signals, frequency dividing the second oscillation signal to produce first and second divided signals, respectively, (d) frequency and phase comparing the reference oscillation signal with the first and second divided signals to produce first and second comparison signals, respectively; and (e) filtering the first comparison signal to produce a filtered signal and supplying the filtered signal to the generating step (b) as the control signal, the time constant of the filtering step (e) being changed in response to the second comparison signal.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
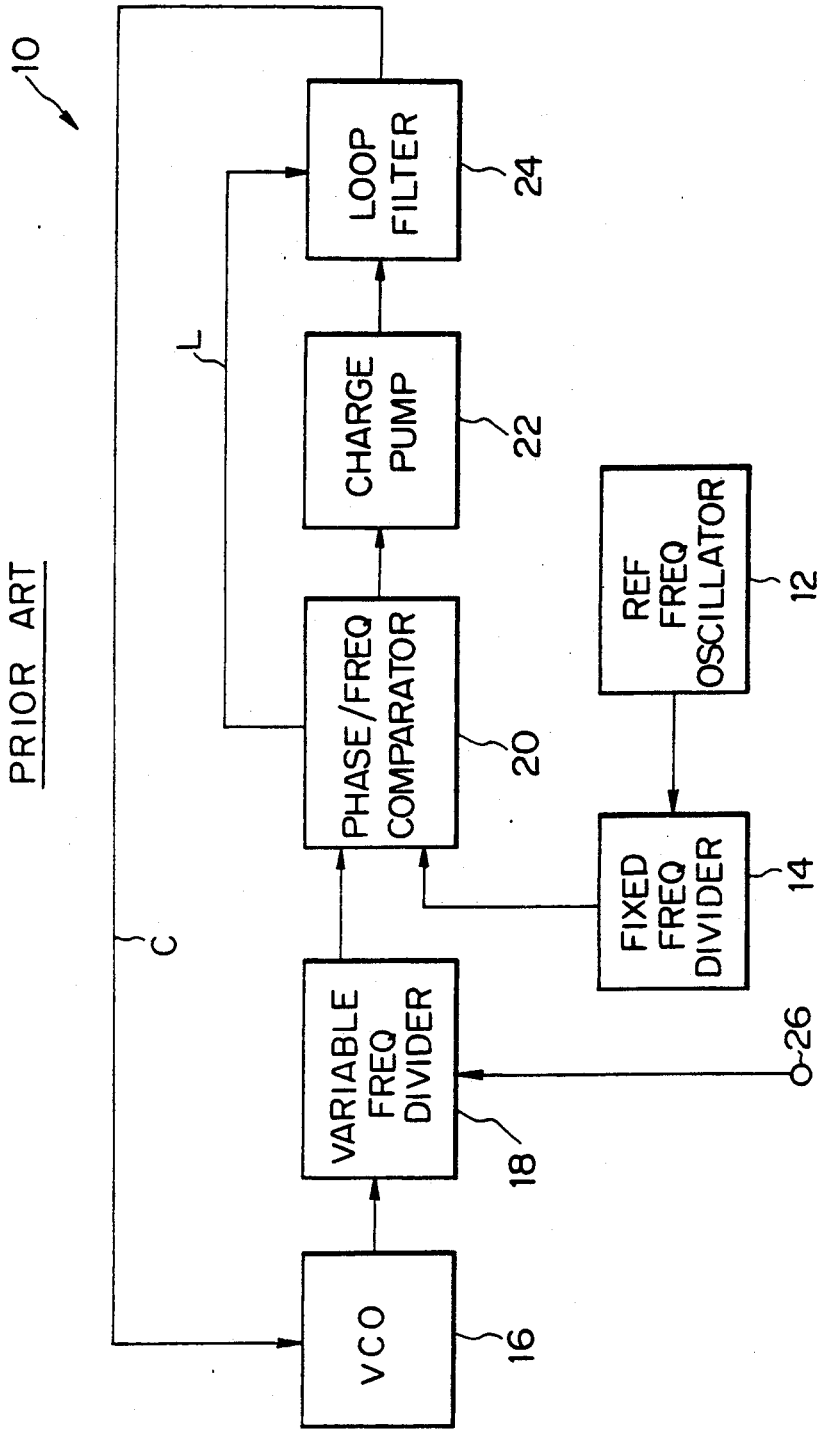
FIG. 1 is a block diagram schematically showing a conventional PLL frequency synthesizer.

To better understand the present invention, a brief reference will be made to a prior art PLL frequency synthesizer, shown in FIG. 1. As shown, the prior art frequency synthesizer, generally 10, has a reference frequency oscillator 12, a fixed frequency divider 14, a VCO 16, a variable frequency divider 18, a phase/frequency comparator 20, a charge pump 22, and a loop filter 24. The fixed frequency divider 14 divides the output of the reference frequency oscillator while the variable frequency divider 18 divides the output of the VCO 16. The phase frequency comparator 20 compares the outputs of the frequency dividers 14 and 18 to produce an output representative of a phase or frequency difference therebetween. The loop filter 24 smoothes the output of the charge pump 22 and then feeds it back to the VCO 16 as a control voltage C. Divisor data is applied to the variable frequency divider 18 via an input terminal 26. A lock signal L is fed from the comparator 20 to the loop filter 24 to switch over the time constant of the latter.

The loop filter 24 has two different time constants one of which is selected at the time of switching and the other is selected after the switching. This is to promote rapid switching and to stabilize the frequency. Specifically, at the time when the frequency is switched over, the loop filter 24 selects a smaller time constant to effect rapid tuning. After the switchover, the loop filter 24 selects a greater time constant in response to the lock signal L fed from the phase/frequency comparator 20, thereby stabilizing the frequency. In practice, however, at the time when the switching operation is completed, the control voltage C applied to the VCO 16 has been deviated from an expected value due to the delay particular to detection and switching, as stated earlier. Therefore, the initial frequency just after the switching is different from a predetermined one with the result that the switchover of the time constant of the loop filter 24 is delayed. This in turn delays the tuning time of the PLL and prevents the frequency to be switched over at high speed.

Figure 2:
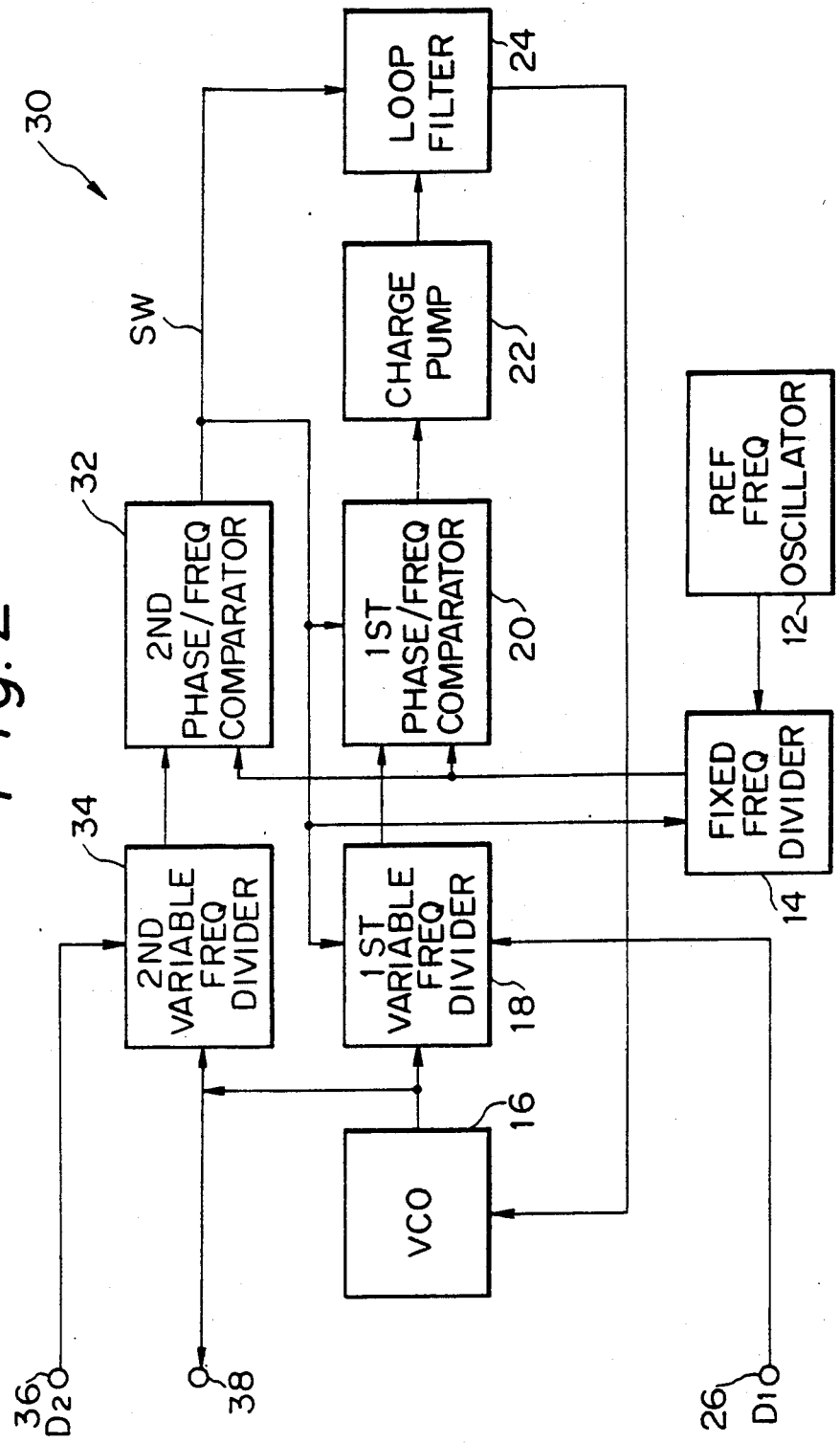
FIG. 2 is a schematic block diagram showing a PLL frequency synthesizer embodying the present invention.

Referring to FIG. 2, a PLL frequency synthesizer embodying the present invention is shown and generally designated by the reference numeral 30. In FIG. 2, blocks functionally equivalent to the blocks of FIG. 1 are designated by the same reference numerals, and redundant description will be avoided for simplicity. Let the phase/frequency comparator 20 and the varible frequency divider 18 shown in FIG. 1 be referred to as a first phase/frequency comparator and a first variable frequency divider, respectively.

As shown in FIG. 2, the frequency synthesizer 30 has a second phase/frequency comparator 32 and a second variable frequency divider 34 in addition to the first phase/frequency comparator 20 and first variable frequency divider 18. The second variable frequency divider 34 divides the output of a VCO 16 while a fixed frequency divider 14 divides the output of a reference frequency oscillator 12. The second phase/frequency comparator 32 compares the outputs of the two frequency dividers 14 and 34. A loop filter 24 switches over the time constant thereof on the basis of the result of comparison outputted by the comparator 32. Particular divisor data is applied to each of input terminals 26 and 36. The output of the frequency synthesizer 30 appears on an output terminal 38.

In operation, the first variable frequency divider 18 divides the output of the VCO 16 by a particular divisor applied thereto via the input terminal 26. The fixed frequency divider 14 divides the output of the reference frequency oscillator 12. The first phase/frequency comparator 20 compares the outputs of the frequency dividers 18 and 14 and delivers the output thereof representative of their difference to a charge pump 22. In response, the charge pump 22 controls the loop filter 20 such that a capacitor included in the loop filter 20 is charged or discharged. The resulting output voltage of the loop filter 20 is fed back to the VCO 16 to effect necessary frequency control.

The output of the VCO 16 is also applied to the second variable frequency divider 34. The frequency divider 34, therefore, divides the output of the VCO 16 by a divisor applied to the input terminal 36. The second phase/frequency comparator 32 compares the output of the variable frequency divider 34 with the output of the fixed frequency divider 14. When the difference between the two frequencies becomes smaller than a pedetermined value, the comparator 32 feeds a switching signal SW to the loop filter 24 to switch over the time constant of the latter. Specifically, in the initial stage of frequency switching operation, the loop filter 24 selects a smaller time constant since the difference or deviation determined by the comparator 32 is greater than the predetermined value. As the switching operation proceeds, the deviation is sequentially reduced. When the deviation becomes smaller than the predetermined value, the comparator 32 causes the loop filter 24 to select a greater time constant by the switching signal SW. At the same time, the switching signal SW is supplied to the first variable frequency divider 18 and fixed frequency divider 14 to reset them and also to the first phase/frequency comparator 20 to initialize it.

Figure 3:
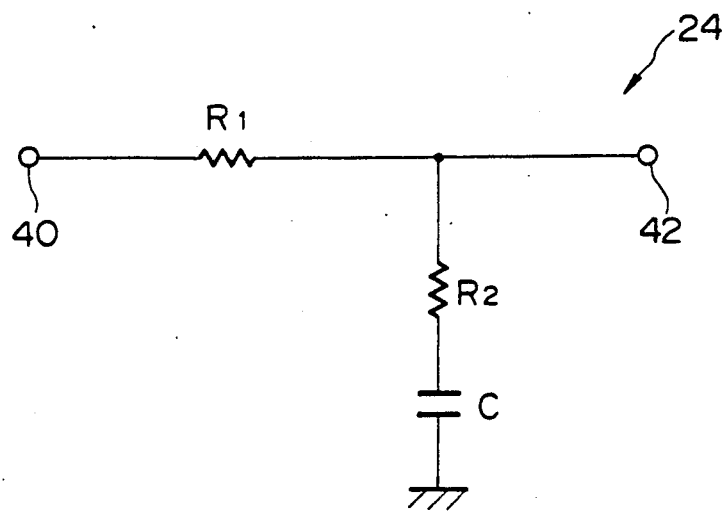
FIG. 3 is a circuit diagram modeling a loop filter included in the embodiment.

Assume that the divisors for frequency division applied to the input terminals 26 and 36 are respectively $D_1$ and $D_2$, and that the divisor initially set in the first variable frequency divider 18 is $D_0$. It is to be noted that the divisors $D_1$ and $D_2$ are stored in a ROM, not shown, and each is fed to one of the input terminals 26 and 36 via a buffer. Also, assume that the predetermined deviation to be detected by the second phase/frequency comparator 32 is $t_1$, and that the time necessary for the loop filter 24 to be switched over is $t_2$. Further, assume that the control voltages $V_1$ and $V_2$ are supplied to the VCO 16 when the loop including the second variable phase/frequency comparator 32 is stabilized with the divisors $D_1$ and $D_2$ applied to the second variable frequency divider 34, respectively, and that the maximum voltage which the charge pump 22 can output is $V_{max}$. As shown in FIG. 3, let the loop filter 24 be molded as a filter made up of resistors $R_1$ and $R_2$, a capacitor C, an input terminal 40, and an output terminal 42.

When the control voltage $D_0$ is lower than the control voltage $D_1$, there holds an equation:

$$t_1 + t_2 = -(R_1 + R_2)C \ln \frac{V_1 - V_{max}}{V_2 - V_{max}}$$

Assuming that the voltage appearing on the output terminal 42 is initially $V_0$, then $$V(t) = V_{max} + R_1/R_1 + R_2(V_0 - V_{max}) \cdot e^{-t/(R_1 + R_2)c}$$

When $t_1$, $t_2$, $R_1$, $R_2$, C and $V_1$ are given, $V_2$ is obtained and, therefore, optimum $D_2$ is produced. Preferably, a frequency intermediate between the frequencies $D_0$ and $D_1$ set in the first variable frequency divider 18 before and at the time of switching, respectively, should be set in the second variable frequency divider 34. Then, the second phase/frequency comparator 32 will output the switching signal SW to switch over the loop filter 24 before the PLL is established in response to the output of the first phase/frequency comparator 20. This is successful in reducing the tuning time of the PLL despite the delay particular to the detection and switching.

In summary, in accordance with the present invention, a PLL frequency synthesizer has a second phase/frequency comparator and a second variable frequency divider in addition to a first phase/frequency comparator which is included in a PLL. The synthesizer switches over the time constant of a loop filter by the output of the second phase/frequency comparator, i.e., independently of the PLL which is responsive to the output of the first phase/frequency comparator. As a result, the time constant of the loop filter is switched over at an advanced timing to thereby reduce the PLL tuning time.

Various modifications will become possible for those skilled in the art after receiving the teachings of the present disclosure without departing from the scope thereof.

What is claimed is:

1. A phase locked loop (PLL) frequency synthesizer for switching an output frequency at high speed, comprising:
   a reference frequency oscillator;
   a voltage controlled oscillator (VCO);
   a first and a second variable frequency divider for dividing an output of said VCO independently of each other, and each being provided with a particular divisor for frequency division;
   a first phase/frequency comparator for comparing an output of said reference frequency oscillator and an output of said first variable frequency divider;
   a second phase/frequency comparator for comparing the output of said reference frequency oscillator and an output of said second variable frequency divider; and
   a loop filter for smoothing an output of said first phase/frequency comparator to feed back a smoothed output thereof to said VCO and switching over a time constant thereof in response to an output of said second phase/frequency comparator.

2. A PLL frequency synthesizer as claimed in claim 1, wherein said divisor of said second variable frequency divider is intermediate between divisors of said first variable frequency divider before and at the time of switching, respectively.

3. A phase-locked loop (PLL) frequency synthesizer comprising:
   reference oscillator means for generating a reference oscillation signal;
   voltage-controlled oscillator (VCO) means for generating a VCO oscillation signal, the frequency of said VCO oscillation signal being varied with a control signal;
   first and second variable frequency divider means for frequency dividing said VCO signal in accordance with first and second divisors, respectively;
   first and second comparator means for phase/frequency comparing said reference oscillation signal with the outputs of said first and second divider means, respectively;
   filter means for filtering the output of said first comparator means to produce a filtered output and supply it to said VCO means as said control signal, the time constant of said filter means being changed in response to the output of said second comparator means.

4. A PLL synthesizer as claimed in claim 3, wherein said second divisor is so selected that the frequency difference between said reference oscillation signal and the output of said second divider means is smaller than the frequency difference between said reference oscillation signal and the output of said first divider means.

5. A PLL synthesizer as claimed in claim 3, further comprising third divider means for frequency dividing said reference oscillation signal in accordance with a predetermined divisor.

6. A method of generating an oscillation signal in response to a divisor signal, comprising the steps of:
   (a) generating a first oscillation signal;
   (b) generating a second oscillation signal whose frequency changes in response to a control signal;
   (c) responsive to first and second divisor signals, frequency dividing said second oscillation signal to produce first and second divided signals, respectively;
   (d) frequency and phase comparing said first oscillation signal with said first and second divided signals to produce first and second comparison signals, respectively; and
   (e) filtering said first comparison signal to produce a filtered signal and supplying said filtered signal to the generating step (b) as said control signal, the time constant of the filtering step (e) being changed in response to said second comparison signal.

* * * * *